United States Patent [19]

Strater et al.

[11] Patent Number: 5,298,434
[45] Date of Patent: Mar. 29, 1994

[54] SELECTIVE RECRYSTALLIZATION TO REDUCE P-CHANNEL TRANSISTOR LEAKAGE IN SILICON-ON-SAPPHIRE CMOS RADIATION HARDENED INTEGRATED CIRCUITS

[75] Inventors: Kurt Strater, Brookside, N.J.; Edward F. Hand, Raleigh, N.C.; William H. Speece, Palm Bay, Fla.

[73] Assignee: Harris Corporation, Melbourne, Fla.

[21] Appl. No.: 832,694

[22] Filed: Feb. 7, 1992

[51] Int. Cl.$^5$ .............................. H01L 21/70
[52] U.S. Cl. .................. 437/21; 437/24; 437/34; 437/40; 437/56; 437/57; 437/83
[58] Field of Search ............ 437/21, 24, 34, 40, 437/41, 56, 57, 83, 84

[56] References Cited

U.S. PATENT DOCUMENTS

| | | | |
|---|---|---|---|
| 4,177,084 | 12/1979 | Lau et al. | 437/24 |
| 4,385,937 | 5/1983 | Ohmura | 437/24 |
| 4,391,651 | 7/1983 | Yoder | 437/24 |
| 4,393,577 | 7/1983 | Imai | 437/24 |
| 4,463,492 | 8/1984 | Maeguchi | 437/21 |
| 4,509,990 | 4/1985 | Vasudev | 437/24 |
| 4,634,473 | 1/1987 | Swartz et al. | 437/21 |
| 4,659,392 | 4/1987 | Vasudev | 437/24 |
| 4,753,895 | 6/1988 | Mayeh et al. | 437/21 |
| 4,775,641 | 10/1988 | Duffy et al. | 437/21 |
| 4,904,611 | 2/1990 | Chiang et al. | 437/24 |

FOREIGN PATENT DOCUMENTS 0033821 4/1981 Japan.
0056417 4/1983 Japan.

*Primary Examiner*—Tom Thomas
*Attorney, Agent, or Firm*—Charles E. Wands

[57] ABSTRACT

A preamorphized silicon layer formed atop a sapphire substrate is selectively recrystallized such that the original degraded quality of the crystallinity of an N-well region where a P-channel device is to be formed is enhanced, so that leakage in the P-channel device is reduced, while the high UVR number of a P-well region where an N-channel device resides remains unaffected. The process according to the present invention involves implanting a recrystallization-inducing element, such as silicon, into only that portion of the preamorphized silicon layer where an N-conductivity well region for a P-channel device is to be formed. An N-conductivity type impurity is introduced into the silicon-implanted portion of the preamorphized silicon layer, to form the N-conductivity well region. The structure is then annealed at a relatively low temperature for several minutes, which is sufficient to activate the phosphorus and to cause local recrystallization of the N-well region of the silicon layer, without essentially causing a redistribution of the phosphorus. What results is a precisely tailored, low leakage P-channel device with a very close to ideal characteristic, integrated in the same SOS structure with a high UVR-based N-channel device.

3 Claims, 2 Drawing Sheets

SELECTIVE RECRYSTALLIZATION TO REDUCE P-CHANNEL TRANSISTOR LEAKAGE IN SILICON-ON-SAPPHIRE CMOS RADIATION HARDENED INTEGRATED CIRCUITS

FIELD OF THE INVENTION

The present invention relates in general to the manufacture of semiconductor devices and is particularly directed a process for reducing P-channel transistor device leakage in CMOS/SOS integrated circuits by selective recrystallization of epitaxial silicon mesa regions on a sapphire substrate, while retaining the highly radiation hardened characteristic of an existing N-channel transistor fabricated in the as-grown silicon mesa region.

BACKGROUND OF THE INVENTION

A beneficial radiation response is observed in CMOS devices fabricated in an inherently degraded silicon heteroepitaxy layer grown upon sapphire substrates. The lattice mismatch between the layer and the substrate is sufficiently different as to result in defects in the layer near the silicon/sapphire substrate. Because of this, silicon-on-sapphire (SOS) architectures are often selected to fabricate radiation-hardened integrated circuits, such as very large scale static random access memories. The defect level of the silicon overlayer can be characterized and controlled by means of ultraviolet (UV) light reflectance, an indirect quantification of the defect twins which produces the favorable response. An identified range of defect densities has been found to aid in reducing the post irradiation leakage of the N-channel transistor and is characterized by a relatively high UV reflectance index or number. Integrated circuit designs such as static RAMs which employ a predominance of N-channel transistors enjoy a significant reduction in leakage current in a radiation environment. On the other hand, this same level of crystal quality produces a correspondingly inferior increase in P-channel transistor leakage. Because of this apparent disparity, a compromise between N and P-channel device leakage is usually encountered. Such a compromise necessarily favors suppression of leakage in the N channel transistor, often allowing the P-channel leakage component to become excessive.

SUMMARY OF THE INVENTION

In accordance with the present invention, the radiation induced leakage trade-off problem is effectively obviated by selectively optimizing the degree of silicon crystallinity within the integrated circuit. The as-grown silicon film is retained for the N-channel device, thereby preserving its desirable radiation response, while the P-channel device crystallinity is discriminately modified to reduce its characteristic leakage.

For this purpose, the process according to the present invention involves the generation of an amorphous layer just above and at the silicon/sapphire interface by controlled implant-inducing damage with an ion such as silicon. Only the portion of the integrated circuit where P-channel transistors (in N-type mesas) will eventually reside are implanted. The remainder of the circuit, where N-channel transistors (P-type mesas) will be located, is protected by way of photomasking. The N-well or reverse P-well layout pattern can be used to achieve this. After the implant, an undamaged single crystal silicon region with a much lower defect density remains at the surface and is used as a seed layer for epitaxial regrowth. The regrowth or recrystallization is accomplished at a low temperature (500–600 degrees centigrade) and is complete in a matter of only a few minutes, similar to conventional solid phase epitaxial (SPE) regrowth processes. Stacking faults and twins are not propagated since the regrowth occurs along the <100> direction from the surface down to the sapphire interface. This operation is truly selective producing a more defect free material in the silicon implanted regions, while the balance of the epitaxial layer remains unaltered (the low temperature recrystallization anneal does not provide sufficient energy to affect the unamorphized regions).

DETAILED DESCRIPTION

Figure 1:
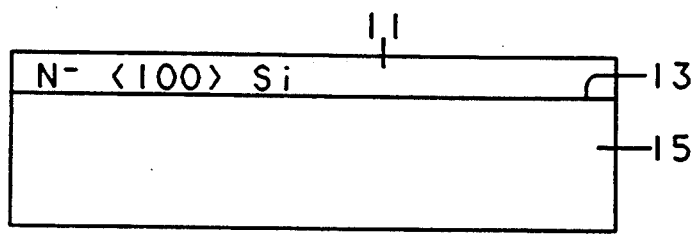
FIGS. 1–5 diagrammatically illustrate a silicon-on-sapphire CMOS architecture at respective steps of its manufacture in accordance with the process of the invention.
Figure 2:
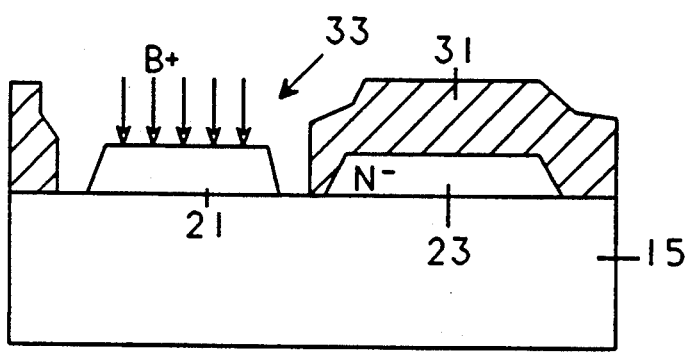

Respective steps of a process for forming a reduced leakage P-channel device within a radiation hardened CMOS/SOS structure in accordance with the present invention are diagrammatically illustrated in FIGS. 1–5. FIG. 1 shows a layer of degraded heteroepitaxial <100> silicon 11 that has been formed atop the appropriate surface orientation 13 of a planar sapphire substrate 15. Silicon layer 11 may be formed by chemical vapor deposition (CVD) epitaxy and is lightly N-type. Silicon layer 11 is patterned by a conventional lithography and etch process, as shown in FIG. 2, to form a pair of mesa regions 21, 23 which will make up the complementary device architecture. Also shown in FIG. 2 is a P-well masking pattern 31 of photoresist, which covers and protects mesa region 23, while exposing mesa region 21 through an aperture 33. Conventional boron ion implantation (B+) and thermal activation (850–1100 degree centigrade) steps are used to dope mesa region 21 to form a P-type mesa to a prescribed concentration.

Figure 3:
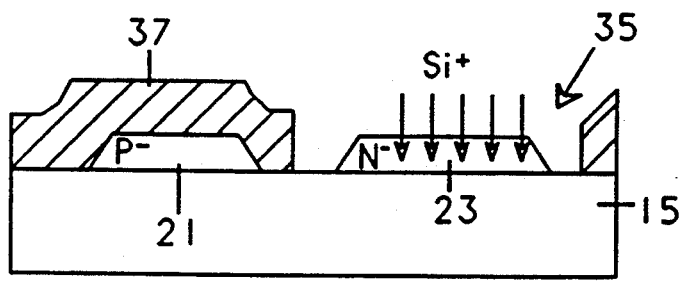

Next, as shown in FIG. 3, P-well lithography mask 31 is removed and an N-well masking layer of photoresist 37 is selectively formed over the structure, such that layer 37 covers P-type mesa region 21 and exposes mesa region 23, in which a P-channel device 39 is to be formed, via aperture 35. In accordance with the present invention, prior to introducing N-type impurities to dope an N-well into mesa 23, the degraded character of mesa 23 is modified by implantation of an amorphizing species ion such as silicon (Si+). For a typical thickness of 40 nm of epitaxial silicon mesa, silicon implant parameters of 1E15 to 5E15 ions/cm$^2$ at an energy of 130 to 160 keV may be employed.

Figure 4:
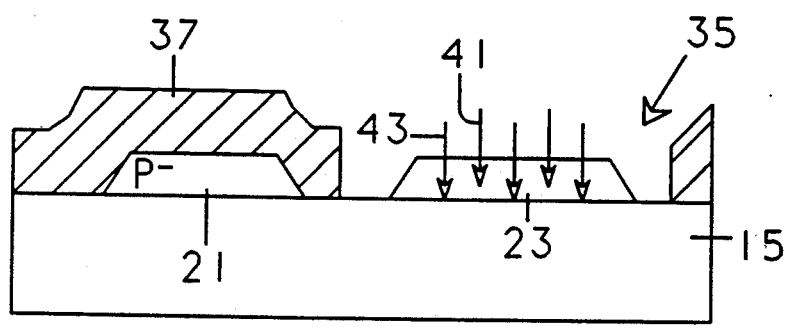
Figure 5:
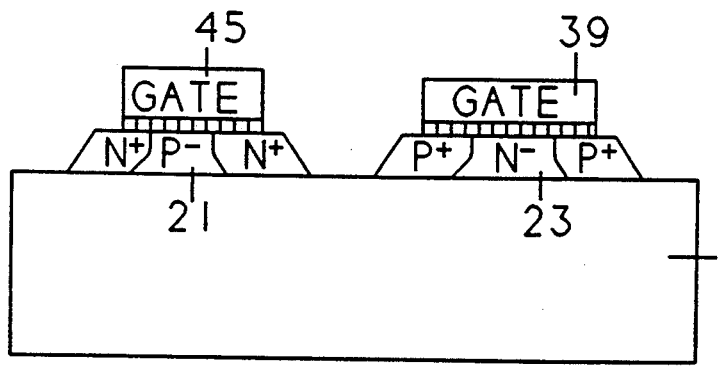

Immediately following the silicon implantation step shown in FIG. 3, successive differential energy/dose N-type implants of phosphorus and/or arsenic are carried out to provide doping for the N well mesa 23, as shown in FIG. 4. For this purpose a low energy/low dose shallow N-type implant 41 into the exposed silicon mesa region 23 is performed, so as to control the transistor surface concentration and threshold voltage. This is then followed by a higher energy/dose deep phosphorus implant 43 having its peak located in mesa region 23 at a depth which controls the device punch-through voltage and backside surface concentration. Advantageously, the preamorphized siliconimplanted mesa 23 produced in FIG. 3 facilitates precise placement of both N-type impurities introduced in FIG. 4 through aperture 35, due to the reduction in channeling and 'trailing tail' formation usually observed in single crystal materials.

With the N-well impurities implanted in conformance with the intended (retrograde) impurity distribution profile for the mesa, the structure is annealed at a temperature sufficient to activate the phosphorus impurities and so as to cause recrystallization of mesa 23. For this purpose, a low temperature anneal in a temperature range of 500 to 600 degrees centigrade may be performed for three to five minutes. Because of these reduced magnitude anneal parameters, there is effectively no redistribution of the implanted phosphorus, so that the implanted retrograde N-well profile does not change. In addition, because the N-well impurities are implanted prior to the recrystallization anneal step, processing time is reduced, as both recrystallization and dopant activation are accomplished at the same time and the presence of the implanted phosphorous accelerates silicon recrystallization. Following the N-well (mesa) anneal, lithography mask layer 37 is stripped off, and source/drain lithography steps are carried out in a conventional manner, to obtain a twin mesa (well) CMOS diagrammatically illustrated in FIG. 5.

As will be appreciated from the foregoing description, the previously discussed radiation hardness/leakage trade-off problem is effectively obviated in accordance with the recrystallization technique of the present invention, through which a silicon layer that imparts high radiation hardness for an N-channel device is selectively modified. The original degraded quality of the crystallinity of the N-well region, where the P-channel device is to be formed, is enhanced, so that leakage in the P-channel device is reduced, while the high UVR number of the P-well region where the N-channel device resides remains unaffected. Because a low temperature anneal employed, the impurity distribution profile does not change from its intended and well defined implanted geometry. What results therefore, in accordance with the inventive process, is a precisely tailored, low leakage P-channel device with a very close to ideal characteristic, integrated in the same SOS structure with a high UVR-based N-channel device.

While we have shown and described an embodiment in accordance with the present invention, it is to be understood that the same is not limited thereto but is susceptible t numerous changes and modifications as known to a person skilled in the art, and we therefore do not wish to be limited to the details shown and described herein but intend to cover all such changes and modifications as are obvious to one of ordinary skill in the art.

What is claimed:

1. A method of reducing leakage in a P-channel device of a CMOS integrated circuit formed within a highly defective structure crystalline silicon layer epitaxially grown on a sapphire substrate, while retaining the high radiation hardness characteristics of an N-channel device within a P-well region of the silicon layer comprising the steps of:
    (a) introducing a recrystallization-inducing element into only that portion of said highly defective structure crystalline silicon layer where an N-conductivity well region is to be formed, while masking said P-well region of said highly defective structure crystalline silicon layer against the introduction of said recrystallization-inducing element, so that si P-well region remains free of said recrystallization-inducing element;
    (b) introducing an impurity of N-conductivity type into said that portion of said highly defective structure crystalline silicon layer to form said N-conductivity well region; and
    (c) annealing the resulting structure at a temperature sufficient to activate said impurity of N-conductivity type within the preamorphized portion of said silicon layer, so as to cause recrystallization of only the preamorphized portion of said silicon layer, exclusive of said P-well region which remains free of said recrystallization-inducing element, and without essentially causing a redistribution of the impurity of said N-conductivity type introduced in step (b).

2. A method according to claim 1, wherein step (c) comprises annealing said structure in a temperature range of 500–600 degrees centrigrade.

3. A method according to claim 1, further including the step of (d) removing, from said P-well region of said highly defective structure crystalline silicon layer, the masking against the introduction of said recrystallization-inducing element, and forming source and drain regions of said N-conductivity type in said P-well region, which remains free of said recrystallization-inducing element, and forming source and drain regions of P-conductivity type in the recrystallized N-conductivity portion of said silicon layer.

* * * * *